United States Patent [19]
Villaume

[11] Patent Number: 5,661,637
[45] Date of Patent: Aug. 26, 1997

[54] THERMAL MANAGEMENT SYSTEM HAVING A THERMALLY CONDUCTIVE SHEET AND A LIQUID TRANSPORTING MATERIAL

[75] Inventor: Henry F. Villaume, Intervale, N.H.

[73] Assignee: Aavid Engineering, Inc., Laconia, N.H.

[21] Appl. No.: 642,810

[22] Filed: May 3, 1996

Related U.S. Application Data

[63] Continuation of Ser. No. 377,634, Jan. 25, 1995, abandoned.
[51] Int. Cl.$^6$ .............................. H05K 7/20; G06F 1/20
[52] U.S. Cl. .................. 361/687; 361/699; 361/700; 165/104.26; 165/104.33; 174/15.2
[58] Field of Search .................. 361/687–689, 361/699, 700, 698; 165/46, 104.33, 104.26; 174/15.2

[56] References Cited

U.S. PATENT DOCUMENTS

| | | | |
|---|---|---|---|
| 4,602,679 | 7/1986 | Edelstein et al. | 165/104.26 |
| 4,880,053 | 11/1989 | Vladimir | 165/104.26 |
| 5,216,580 | 6/1993 | Davidson et al. | 361/700 |
| 5,309,986 | 5/1994 | Itoh | 165/104.26 |
| 5,331,510 | 7/1994 | Ouchi et al. | 361/702 |
| 5,383,340 | 1/1995 | Larson et al. | 62/259.2 |
| 5,409,055 | 4/1995 | Tanaka et al. | 165/104.33 |
| 5,560,423 | 10/1996 | Larson et al. | 165/104.26 |

Primary Examiner—Michael W. Phillips
Assistant Examiner—Jayprakash N. Gandhi
Attorney, Agent, or Firm—Cohen, Pontani, Lieberman, Pavane

[57] ABSTRACT

A thermal management system having an enclosure comprising a pair of enclosure regions disposed on opposite surfaces of a flexible thermally conductive sheet. The enclosure regions are coupled together through an aperture provided in the sheet. A liquid transporting material is disposed within the enclosure and passes between the enclosure regions through the aperture. A liquid is disposed on the liquid transporting material. One end portion of the thermally conductive sheet is adapted for thermal coupling to a heat source and the opposite end portion is adapted for thermal coupling to a heat sink. Heat emanating from the heat source passes though the thermally conductive sheet to the liquid to convert the liquid to a vapor. The vapor passes within, and through, the enclosure regions for transportation to the end of the liquid transporting material disposed adjacent the heat sink coupling end of the thermally conductive material. The transported vapor is condensed to the liquid as the vapor transfers its heat through the thermally conductive sheet to the heat sink. The condensed liquid is then transported by capillary action provided by the liquid transporting material back to the other end thereof to complete one of a series of continuously repeating heat transfer cycles.

26 Claims, 4 Drawing Sheets

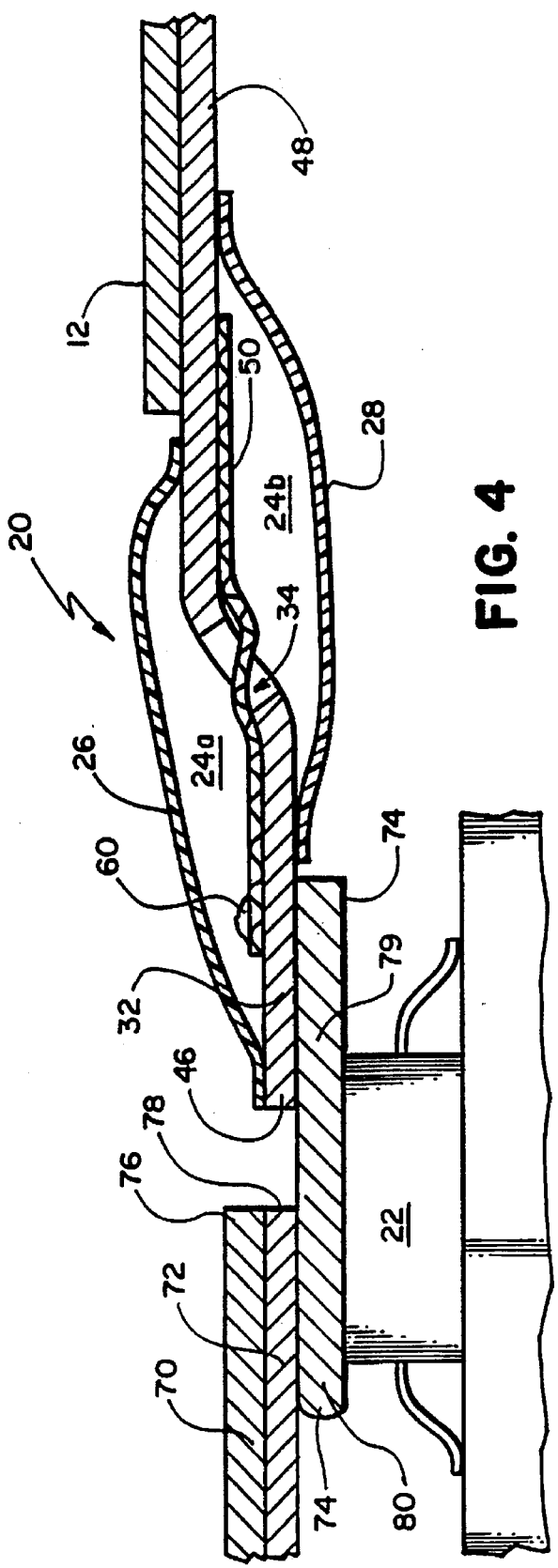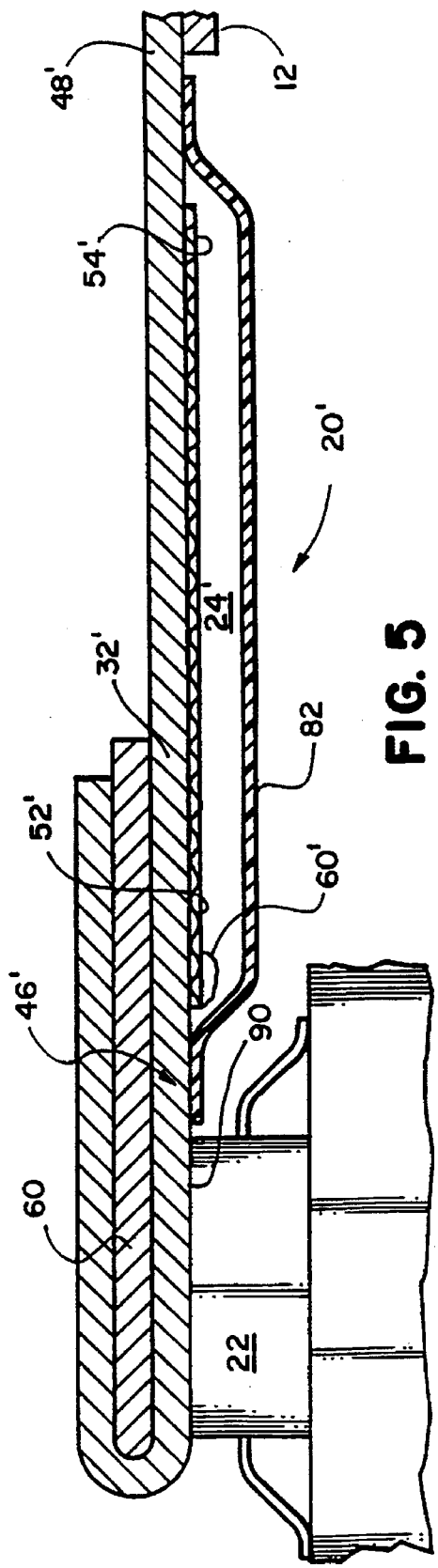

5,661,637

THERMAL MANAGEMENT SYSTEM HAVING A THERMALLY CONDUCTIVE SHEET AND A LIQUID TRANSPORTING MATERIAL

This is a continuation of application Ser. No. 08/377,634, filed Jan. 25, 1995, now abandoned.

BACKGROUND OF THE INVENTION

This invention relates generally to thermal management systems and more particularly to thermal management systems adapted for use in electronics systems such as, for example, portable computers.

As is known in the art, with the growth of personal computers, there has been increasing demand for portable computers, such as notebook, laptop and palmtop digital computers. The first portable computers, known as "lugables", were AC powered and utilized the same power supply, and printed circuit board technology, as their desk top cousins. Over time, advancements in power generation (i.e., the use of rechargeable batteries), and power management (i.e., extending the time interval between battery charges) have further reduced their size thereby further increasing their usefulness and demand. However, removal of heat generated by electronic components, or other heat generating source, within a small notebook computer is significantly more difficult than removal of heat from a desk top computer. Because of the relatively large space available in a desk top computer, heat transfer may be managed through the use of fans and principles of thermal convection cooling. Notebook computers, on the other hand, because of the more limited space, are not suitable candidates for cooling fan, or forced convection type thermal management systems.

Techniques and devices which have been suggested to manage heat in notebook computers are discussed in an article entitled "Hot Problem? Cool Solution!", by Gary Kuzmin, published in EDN Products Edition, Feb. 21, 1994. One system described therein is referred to as the Oasis™ fluid cooler. Such system operates in similar fashion to a heat pipe; however, it includes flexible, plastic materials forming an enclosure, allowing the pressure inside the enclosure to equalize with the pressure outside the enclosure. The operating temperature remains constant for wide heat load variations because it is a boiling heat transfer system. More particularly, a liquid boils in the enclosure attached to the component to be cooled. The resulting vapor condenses back to a liquid as it releases its heat to a condensing wall of the enclosure at the other end. The liquid then flows back to the evaporator, completing one of a series of constantly repeating cycles. While such system is adequate in some applications, it is not able to operate in all orientations. More particularly, the condensing wall (i.e., heat sink) must be at a higher elevation than the component to be cooled (i.e, the heat source). In other applications, however, it may be desirable to remove the orientation dependence of the system, as well as reduce the complexity and cost of such system.

In another suggested system, a capillary arrangement is used to transfer the condensed vapor back to the heat sink. More particularly, an enclosure is provided with portions thereof comprising a thin flexible, thermally conductive sheet and a flexible, typically plastic, membrane. The flexible membrane has peripheral ends attached to a first surface of the thermally conductive sheet. One end of the opposite surface of the thermally conductive sheet is adapted for mounting to a heat source. The other end of the aforementioned opposite surface of the thermally conductive sheet is adapted for coupling to a heat sink. A fibrous, liquid transporting material is disposed within the enclosure. Opposite end portions of the fibrous material are disposed adjacent the heat source and the heat sink, respectively. A small amount of liquid is disposed on the end of the material adjacent the heat source. Heat emanating from the heat source is received by the thin thermally conductive sheet and transferred to the liquid thereby converting the liquid to a vapor. The vapor passes within, and through, the enclosure for transportation to the end of the fibrous material disposed adjacent the heat sink. The transported vapor is condensed to the liquid as the vapor transfers its heat through the thin thermally conductive sheet to the heat sink. The condensed liquid is then transported by capillary action provided by the fibrous material back to the heat source to complete one of a series of continuously repeating heat transfer cycles.

SUMMARY OF THE INVENTION

With this background of the invention in mind it is an object of this invention to provide an improved thermal management system.

It is another object of the invention to provide an improved thermal management system adapted for use in wide range of applications.

It is another object of the invention to provide a relatively simple, inexpensive, thermal management system adapted to operate independent of heat source-heat sink orientation and adapted to provide greater flexibility in mounting to a heat source and heat sink.

It is still a further object of the invention to provide an improved capillary type thermal management system, such system being adapted to operate with increase thermal loads and over a wider range of configurations.

These and other objects of the invention are attained generally by providing a thermal management system having an enclosure with portions thereof comprising a thin flexible, thermally conductive sheet and a pair of flexible membranes. A first one of the flexible membranes has peripheral ends attached to a one surface of the thermally conductive sheet to form a first enclosure region. The second one of the flexible membranes has peripheral ends attached to the opposite surface of the thermally conductive sheet to form a second enclosure region. Thus, the first and second enclosure regions of the enclosure are disposed on opposite sides of the thermally conductive sheet. The thermally conductive sheet has an aperture formed therein to provide a passageway between the first and second enclosure regions. One end portion of the thermally conductive sheet is adapted for thermal coupling to a heat source and the opposite end portion is adapted for thermal coupling to a heat sink. A fibrous, liquid transporting material is disposed within the enclosure. The fibrous material passes between the first and second enclosure regions through the passageway provided by the aperture in the thermally conductive sheet. Opposite end portions of the fibrous material are disposed adjacent to the heat source coupling end and the heat sink coupling end of the thermally conductive sheet, respectively. A small amount of liquid is disposed on a first end of the fibrous material adjacent the heat source coupling end of the thermally conductive sheet. Heat emanating from the heat source passes through the thermally conductive sheet to the liquid to convert the liquid to a vapor. The vapor passes within, and through, the enclosure regions for transportation to a second end of the fibrous material disposed adjacent the heat sink coupling end of the thermally conductive material. The transported vapor is condensed to the liquid as the vapor transfers its heat through the thermally conductive sheet to the heat sink. The condensed liquid is then transported by capillary action provided by the fibrous material back to the first end of the fibrous material to complete one of a series of continuously repeating heat transfer cycles. With such arrangement, the heat source and heat sink may be mounted to opposite surfaces of the thermally conductive sheet thereby enabling the system to operate in a wider range of configurations.

In accordance with another feature of the invention, portions of the thermally conductive sheet providing the heat sink coupling end thereof are folded 180 degrees to increase the effective thickness of the sheet relative to the thickness of the portions of the sheet used to provide a portion of the flexible enclosure. With such an arrangement, the amount of heat which may be transferred from the heat source to the heat sink is increased without adversely effecting the flexibility of the enclosure.

BRIEF DESCRIPTION OF THE DRAWING

FIG. 4 is cross sectional, partially broken away view of the alternative embodiment of a thermal management system adapted for use in the portable computer of FIG. 3; and, FIG. 5 is a cross sectional, partially broken away view of another alternative embodiment of a thermal management system adapted for use in the portable computer of FIG. 1.

DESCRIPTION OF THE PREFERRED EMBODIMENTS

Figure 1:
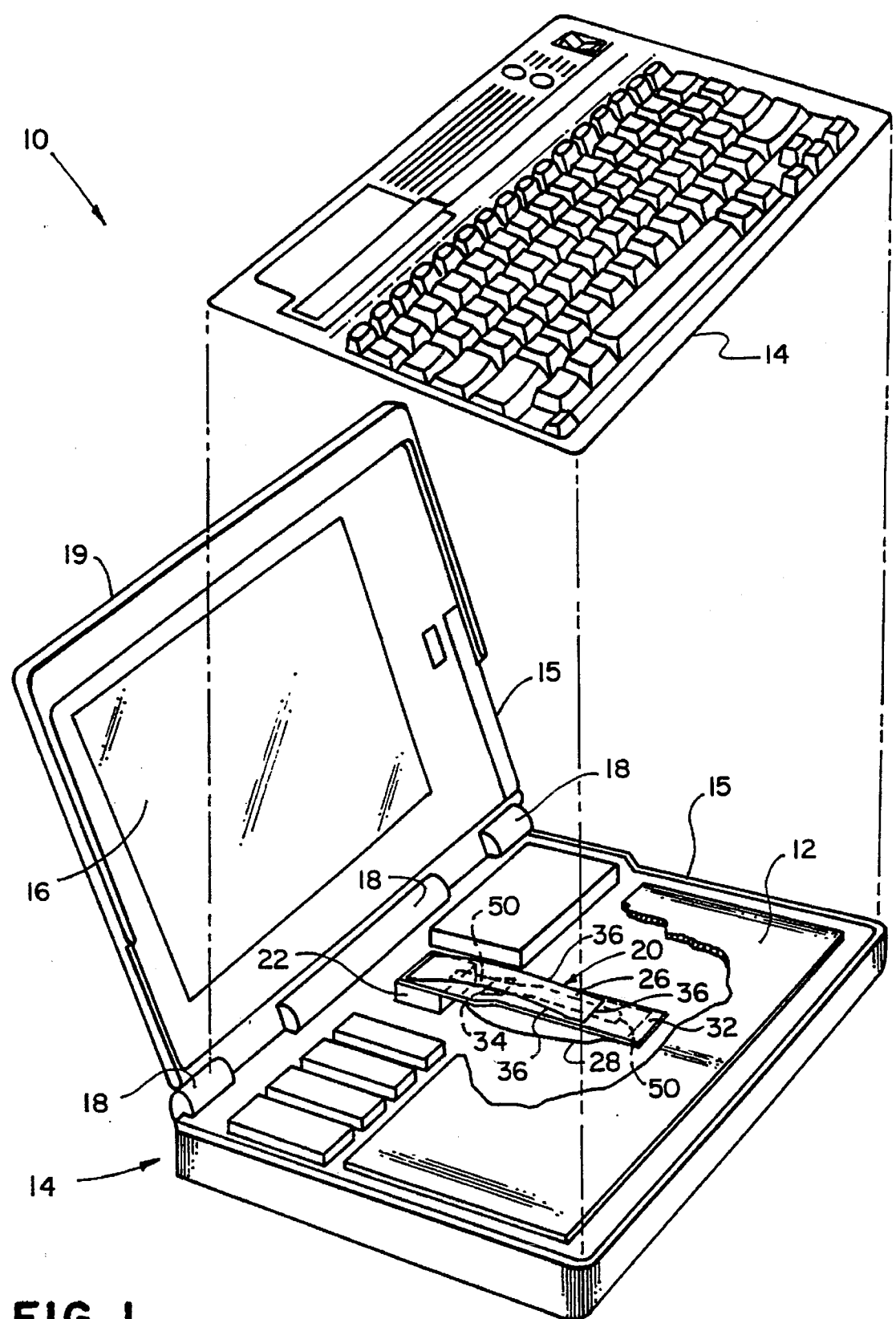
FIG. 1 is an exploded simplified sketch of a portable computer having a thermal management system according to the invention.
Figure 2:
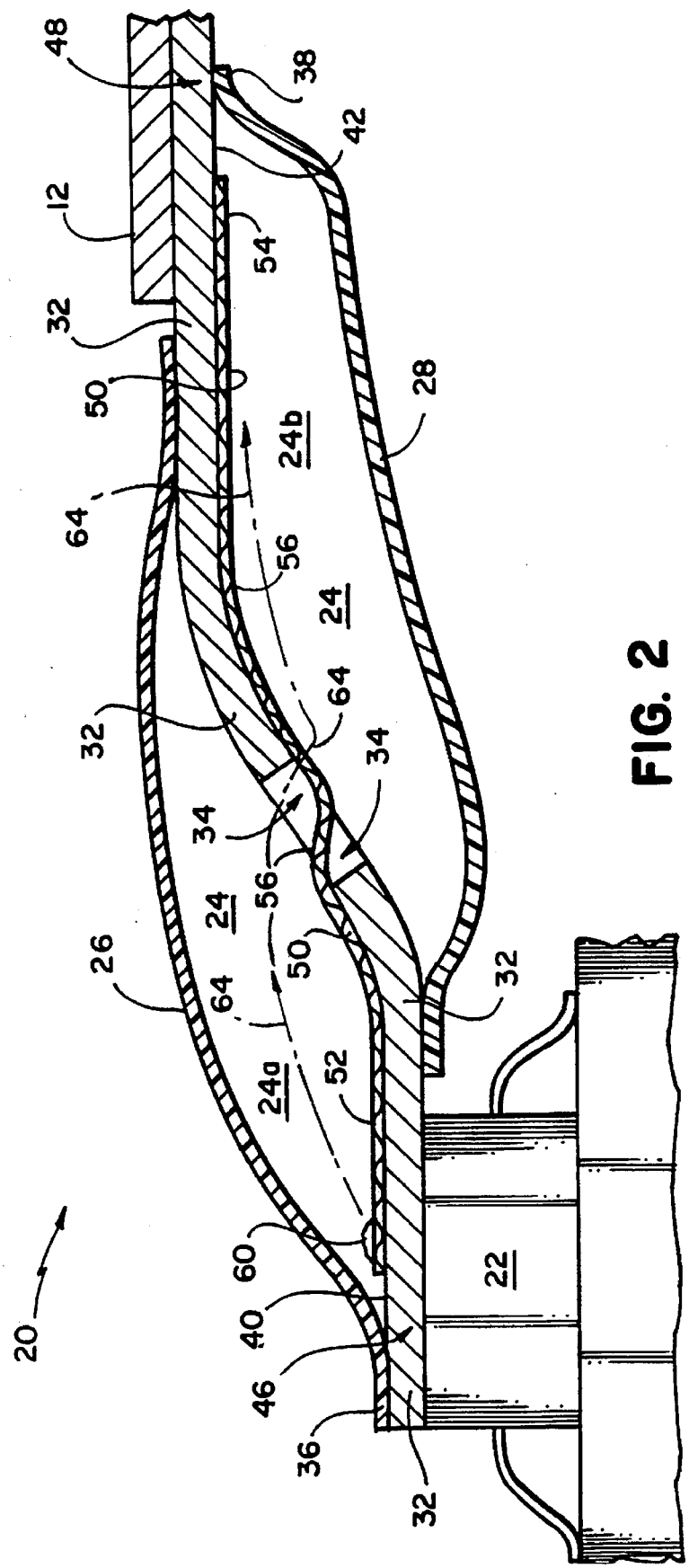
FIG. 2 is a cross sectional, partially broken away view of the thermal management system used in the portable computer of FIG. 1.

Referring now to FIGS. 1 and 2, a portable computer 10, here a notebook computer, is shown. The computer 10 includes a heat radiating surface, here a mounting plate 12 for keyboard 14. The display panel 16 is adapted, in a conventional manner, to fold between an upright position, as shown, and a closed position, via hinges 18. The outer cover 19 of the display panel 16 provides a portion of the computer case 15 when in the closed position. A thermal management system 20 is provided for removing heat generated by an electrical component, here a microprocessor 22. It should be noted that the thermal management system 20 may be used to remove heat from another heat generating source, such as a battery, not shown, disposed in the computer case 15.

More particularly, the thermal management system 20 transfers heat from the microprocessor 22, to a heat sink, here, the keyboard mounting plate 12. The thermal management system 20 includes an enclosure 24 (FIG. 2). The enclosure 24 comprises: a pair of flexible, here plastic, membranes 26, 28; and, a thin, flexible, thermally conductive sheet 32, here aluminum having a thickness of, here approximately 0.032 inches. The thermally conductive sheet 32 has an aperture 34 formed through a central region thereof, as shown. One of the plastic membranes 26, 28, here membrane 26 has peripheral edge portions 36 thereof affixed, here by any suitable epoxy, to one surface, here the upper surface 40 of the thermally conductive sheet 32 to form a first enclosure region 24a. The other one of the plastic membranes 26, 28, here membrane 28 has peripheral edge portions 38 thereof affixed, here also by any suitable epoxy, to the other surface, here the lower surface 42 of the thermally conductive sheet 32, to form a second enclosure region 24b. The first and second enclosures 24a, 24b are coupled together by the aperture 34 providing a passageway through the conductive sheet 32. Thus, the first and second enclosure regions 24a, 24b, of the enclosure 24 are disposed on opposite surfaces of the thermally conductive sheet 32. It should be noted that the lower surface of ends 46 and the upper surface of end 48 of thermally conductive sheet 32 are not covered by the plastic membrane 28 to thereby provide a pair of exposed end portions for the lower and upper surfaces of the thermally conductive sheet 32. The exposed ends 46, 48 provide mounting, or coupling ends for the thermally conductive sheet 32. End 46 is a heat source coupling end and end 48 is a heat sink coupling end. The mounting ends 46, 48 are thermally coupled to, here affixed to, the top of the microprocessor 22 (i.e., a heat source) and the bottom surface of keyboard mounting plate 12 (i.e., a heat sink), respectively, as shown, by a suitable thermally conductive epoxy. More particularly, the lower surface of the heat source coupling end 46 is mounted to the heat source (i.e., microprocessor 22) and the upper surface of heat sink coupling end 48 is mounted to the heat sink (i.e., the keyboard mounting plate 12). Thus, the heat source and heat sink are mounted to opposite surfaces of the thermally conductive sheet 32.

Disposed within the enclosure 24 is a fibrous material 50, here an open weave Dacron™ material manufactured by E. I. Dupont. A first end portion 52 of the fibrous material 50 is disposed adjacent, here disposed over a portion of, the upper surface of the heat source coupling end 46 of thermally conductive sheet 32, and the opposite, second end portion 54 of the fibrous material 50 being disposed adjacent, here disposed under a portion of, the lower surface of the heat sink coupling end 48 of thermally conductive sheet 32. The intermediate, here middle, section 56 of the fibrous material passes through the passageway provided by aperture 34 formed in the thermally conductive sheet 32, as shown. A small quantity of a liquid 60, here approximately a quarter teaspoon, of Fluorinert™ liquid manufactured by 3M, is disposed on the first end portion 52 of the fibrous material 50 disposed on the heat source coupling end 46, here over, the microprocessor 22, as shown. Heat generated by, and emanating from, the operation of the microprocessor 22 causes the liquid 60 to evaporate and change to a vapor represented by arrow 64. The vapor is confined by the enclosure 24 and passes from enclosure region 24a, through passageway provided by the aperture 34, to enclosure region 24b. The vapor condenses on the second end portion 54 of the fibrous material 50 disposed on the heat sink coupling end 48 of the thermally conductive sheet 32. The vapor is condensed as it releases heat to the heat sink, here the keyboard mounting plate 12. The condensed vapor thereby is converted to a liquid state and, in such liquid state, is transported by capillary action provided by the fibrous material 50 to the first end portion 52 thereof disposed on the heat source coupling end 46 of the thermally conductive sheet 32. This completes one of a continuously repeating heat transfer cycle.

Figure 3:
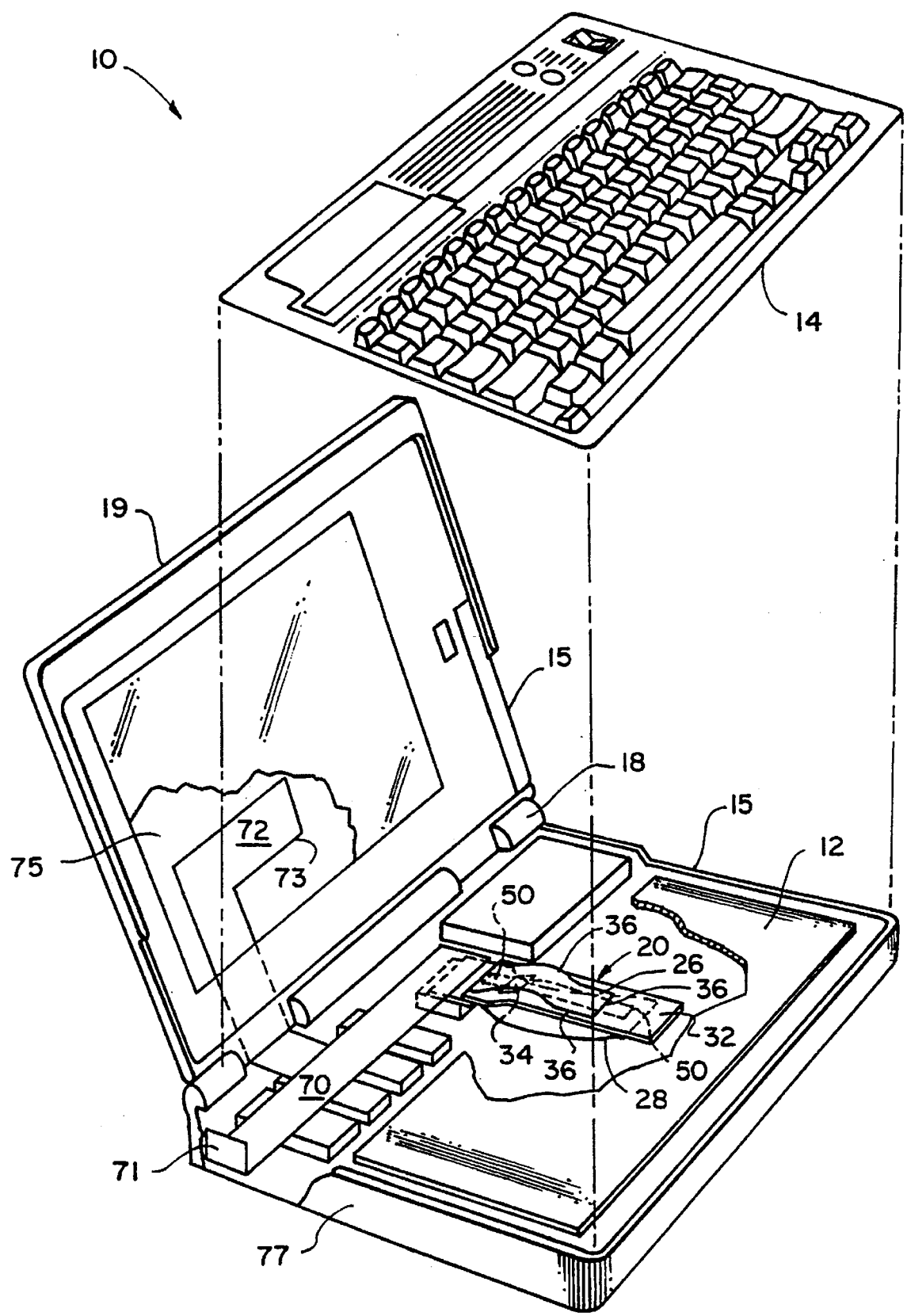
FIG. 3 is an exploded simplified sketch of a portable computer having a thermal management system according to an alternative embodiment of the invention.

Referring now to FIGS. 3 and 4, the portable computer 10 includes the thermal management system 20; here, however, the thermal management system 20 includes a plurality of, here, two thin, flexible thermally conductive sheets 70, 72.

More particularly, a thermal spreader 74, here a sheet of aluminum, is disposed on the top of the microprocessor 22, as shown. The lower surface of heat source coupling end 46 of the thermally conductive sheet 32 is thermally coupled to, here bonded to, one surface portion 79 of the spreader 74, as shown, with a suitable thermally conductive epoxy. It is noted that a portion of the spreader 79 and end 52 of fibrous material 50 are disposed over one another. The other surface portion 80 of the spreader 74 is thermally coupled, again bonded with a thermal conductive epoxy, to the flexible, thermally conductive sheets 70, 72. Thus, each one of the sheets 70, 72 has first ends 76, 78 respectively, in thermal contact with the microprocessor 22. Second ends 71, 73, respectively, of such sheets 70, 72 are in thermal contact with a mounting plate 75 for the display panel 16 (FIG. 1), and a side portion 77 of portable computer case 15, as described in copending patent application Ser. No. 08/377, 641 filed concurrently herewith, inventor Gary Kuzmin, assigned to the same assignee as the present invention, such patent application being incorporated herein by reference.

Referring now to FIG. 5, the management system 20' includes an enclosure 24' having a flexible, thermally conductive sheet 32', here again aluminum, and a plastic sheet 82 with peripheral edges thereof affixed to the thermally conductive sheet 32', as shown. Again, the thermal management system 20' transfers heat from the microprocessor 22, to a heat sink, here, the keyboard mounting plate 12. It should be noted that the ends of the thermally conductive sheet 32' provide a pair of heat source, heat sink coupling ends 46', 48', respectively, for the thermally conductive sheet 32'. The heat source-heat sink coupling ends 46', 48' are thermally coupled to the top of the microprocessor 22 and the keyboard mounting plate 12, respectively, as shown. The heat source coupling end 46' of sheet 32' is folded 180 degrees over a thermally conductive spreader 60, as shown to increase the effective thickness of the heat source mounting end of the sheet 32' relative to the thickness of the sheet 32' providing the enclosure 24'. That is, here the microprocessor 22 is not disposed under an end portion of the fibrous material 54" but rather is mounted to a laterally extending portion 90 of sheet 32'. In order to reduce the thermal gradient between the heat source (here, microprocessor 22) and the heat sink (here, keyboard mounting plate 12), the portion of the thermally conductive sheet 32' which are adapted for mounting to the heat source (i.e., the laterally extending portion 90) is folded 180 degrees to increase the effective thickness of the sheet 32' relative to the thickness of the portions of the sheet 32' used to provide a portion of the enclosure 24'. In this way, the amount of heat which may be transferred from the heat source is increased without adversely effecting the high degree of flexibility if the enclosure.

It should be noted that the enclosure 24' is here made up of a single enclosed region, however, the used of a fold in the heat sink coupling end of the thermally conductive sheet may be used in connection with the two enclosure regions 24a, 24b embodiments described above in connection with FIGS. 1–4. It should also be noted that the enclosure 24' includes portions of the plastic sheet 82 and portions of the thermally conductive sheet 32'. Disposed within the enclosure 24' is the fibrous material 50', here again an open weave Dacron™ material manufactured by E. I. Dupont. A first end portion 52' of the fibrous material 50' is disposed on the surface of the heat source coupling end 46' of the thermally conductive sheet 32', the other, second end portion 54' of the fibrous material 50' is disposed on the heat sink coupling end 48' of the thermally conductive sheet 32'. A liquid 60', here a small quantity (here about a quarter teaspoon) of Fluorinert$_{TM}$ liquid, is disposed on the first end portion 52' of the fibrous material 50' disposed adjacent to the microprocessor 22. Heat generated by, and emanating from, the operation of the microprocessor 22 causes the liquid 60' to evaporate and change to a vapor state. The vapor is confined by the enclosure 24' and passes through the enclosure 24' to the end portion 54' disposed adjacent the keyboard mounting plate 12. The vapor condenses on the second end portion 54' of the fibrous material 50'. The vapor is condensed as it releases heat to the heat sink, here the keyboard mounting plate 12. The condensed vapor thereby is converted to a liquid state and, in such liquid state, is transported by the fibrous material 50' to the first end portion 52' thereof. This completes one a continuously repeating heat transfer cycles.

Having described embodiments of the invention, other embodiments incorporating its concepts will now become readily apparent to those of skill in the art. It is felt, therefore, that the invention should not be restricted to the disclosed embodiments but rather should be limited only by the spirit and scope of the appended claims

What is claimed is:

1. A thermal management system, comprising:
   (a) an enclosure comprising a pair of enclosure regions disposed over opposite surfaces of a thermally conductive member, such enclosure regions being coupled together through an aperture provided in the thermally conductive member;
   (b) a liquid transporting material disposed within the enclosure and passing between the first enclosure region and the second enclosure region through the aperture; and
   (c) a liquid disposed on the liquid transporting material.

2. The thermal management system recited in claim 1 wherein the enclosure is flexible.

3. A thermal management system, comprising:
   (a) an enclosure comprising a pair of enclosure regions disposed over opposite surfaces of a thermally conductive member, such enclosure regions being coupled together through an aperture provided in the thermally conductive member;
   (b) a liquid transporting material disposed within the enclosure, the liquid transporting material having one end portion disposed in the first enclosure region, a second end portion disposed in the second enclosure region, and an intermediate section of the liquid transporting material passing through the aperture; and
   (c) a liquid disposed on the liquid transporting material.

4. The thermal management system recited in claim 3 wherein the enclosure is flexible.

5. A thermal management system, comprising:
   (a) an enclosure comprising:
      (i) a thin flexible, thermally conductive sheet having an aperture formed therein, one end portion of the thermally conductive sheet being adapted for thermal coupling to a heat source and the opposite end portion being adapted for thermal coupling to a heat sink; and
      (ii) a pair of flexible membranes, a first one of the flexible membranes having peripheral ends attached to a one surface of the thermally conductive sheet, such first one of the sheets being disposed over the aperture, and a second one of the flexible membranes having peripheral ends attached to the opposite surface of the thermally conductive sheet, such second one of the sheets being disposed over the aperture;

(b) a liquid transporting material disposed within the enclosure, the liquid transporting material having opposite end portions disposed adjacent the heat source coupling end and the heat sink coupling end of the thermally conductive sheet, respectively, such liquid transporting material passing through the aperture formed in the thermally conductive sheet; and (c) a liquid disposed on the liquid transporting material.

6. The thermal management system recited in claim 5 wherein the liquid is adapted for conversion to a vapor from heat emanating from a heat source coupled to the heat source coupling end of the thermally conductive sheet, such vapor being adapted to passes through the enclosure to the heat sink coupling end of the thermally conductive sheet for condensation to the liquid as the vapor transfers heat therein to the heat sink, the liquid transporting material being adapted to then transport the condensed liquid to end of the material disposed adjacent the heat source coupling end of the thermally conductive sheet.

7. Apparatus for transferring heat from a heat source to a heat sink, comprising:

an enclosure having a portion of a surface thereof comprising a thermally conductive material, the thermally conductive material having a pair of thermally conductive mounting ends, a first one of the mounting ends being adapted for thermal coupling to the heat source, and a second one of the mounting ends being adapted for thermal coupling to the heat sink, different regions of the enclosure being disposed over different surfaces of the thermally conductive material;

a fibrous, liquid transporting capillary material disposed within the enclosure, a first end of the capillary material being disposed over the first mounting end of the thermally conductive material and a second end of the capillary material being disposed under the second mounting end, such material passing within the different regions of the enclosure;

a liquid disposed on the first end of the capillary material, such liquid being adapted for conversion to a vapor from heat emanating from the heat source, such vapor being adapted to passes through the enclosure to the second mounting end of the thermally conductive material sheet for condensation to the liquid as the vapor transfers heat therein to the heat sink, the capillary material being adapted to then transport the condensed liquid to first end of the capillary material to complete one of a series of heat transfer cycles.

8. The apparatus recited in claim 7 wherein the different enclosure regions are coupled together through an aperture provided in the thermally conductive material.

9. The apparatus recited in claim 8 wherein the capillary material passes through the aperture.

10. The apparatus recited in claim 7 wherein the capillary material has one end thereof disposed in one of the enclosure regions and another end thereof disposed in the other one of the enclosure region.

11. A method of transporting heat generated by a heat source to a heat sink, comprising the steps of:

(a) providing an enclosure comprising a pair of enclosure regions disposed on opposite surfaces of a thermally conductive member, such enclosure regions being coupled together through an aperture provided in the thermally conductive member, such enclosure having a liquid transporting material disposed therein passing between the first enclosure region and the second enclosure region through the aperture, such liquid transporting material having a liquid disposed on the portion thereof disposed in the first enclosure region;

(b) coupling heat from the heat source to the liquid to change the liquid to a vapor;

(c) transporting the vapor through the enclosure;

(d) coupling heat in the vapor to the heat sink to change the vapor to a liquid; and (e) transporting the liquid to the first enclosure region through the liquid transporting material.

12. The method recited in claim 11 including the steps of repeating (b) coupling heat from the heat source to the liquid to change the liquid to a vapor;

(c) transporting the vapor through the enclosure;

(d) coupling in the vapor to the heat sink to change the vapor to a liquid; and (e) transporting the liquid to the first enclosure region through the liquid transporting material.

13. A portable computer, comprising:

a heat radiating surface, such computer case having a display panel, such display panel being adapted to fold between an upright position and a closed position, such display panel providing a portion of the case when in the closed position, a portion of such case and keyboard mounting plate providing a portion of an enclosure;

a heat generating source disposed within the enclosure; and, a thermal management system, comprising:

an enclosure having a portion of a surface thereof comprising a thermally conductive sheet, the thermally conductive sheet having a pair of thermally conductive mounting ends, a first one of the mounting ends mounted to the heat generating source, and a second one of the mounting ends being mounted to the heat radiating surface, such enclosure having different regions thereof disposed over different surfaces of the thermally conductive sheet;

a material disposed within the enclosure and passing through the different regions of the enclosure, a first end of the material being disposed in one enclosure region adjacent the first mounting end of the sheet and a second end of the material being disposed in a different enclosure region adjacent the second mounting end of the sheet;

a liquid disposed on the first end of the material, such liquid being adapted for conversion to a vapor from heat emanating from the heat generating source, such vapor being adapted to passes through the enclosure to the second mounting end of the thermally conductive sheet for condensation to the liquid as the vapor transfers heat therein to the heat generating component, the material being adapted to then transport the condensed liquid to first end of the material to complete one of a series of heat transfer cycles.

14. The computer recited in claim 13 wherein the thermally conductive sheet has an aperture formed therein and wherein the material passes through the aperture.

15. The computer recited in claim 14 wherein the different enclosure regions are coupled together through the aperture.

16. A portable computer, comprising:

a microprocessor disposed within the computer; and, apparatus for transferring heat from the microprocessor to a heat sink, comprising:

an enclosure having a portion of a surface thereof comprising a thermally conductive sheet, the thermally conductive sheet having a pair of thermally conductive mounting ends, a first one of the mounting ends being adapted for disposition in thermal contact with the microprocessor, and a second one of the mounting ends being adapted for disposition in thermal contact with the heat sink, such enclosure having different regions thereof disposed over different surfaces of the thermally conductive sheet;

a material disposed within the enclosure and passing through the different regions of the enclosure, a first end of the material being disposed adjacent to the first mounting end of the thermally conductive sheet and a second end of the material being disposed adjacent to the second mounting end;

a liquid disposed on the first end of the material, such liquid being adapted for conversion to a vapor from heat emanating from the microprocessor, such vapor being adapted to passes through the enclosure to the second mounting end of the thermally conductive sheet for condensation to the liquid as the vapor transfers heat therein to the heat sink, the material being adapted to then transport the condensed liquid to first end of the material to complete one of a series of heat transfer cycles.

17. The apparatus recited in claim 16 wherein the thermally conductive sheet has an aperture formed therein and wherein the material passes through the aperture.

18. The apparatus recited in claim 17 wherein the different enclosure regions are coupled together through the aperture.

19. The apparatus recited in claim 18 wherein the material has one end thereof disposed in one of the enclosure regions and another end thereof disposed in the other enclosure region.

20. The computer recited in claim 16 including a flexible thermally conductive sheet disposed in the computer and having an end portion thereof thermally coupled to the microprocessor.

21. The portable computer recited in claim 20 wherein the flexible thermally conductive sheet has a second end thermally coupled to a heat radiating surface of the computer.

22. A thermal management system, comprising:
(a) an flexible enclosure having a flexible thermally conductive sheet an end portion of the thermally conductive sheet extending beyond the enclosure;
(b) a liquid transporting material disposed within the enclosure;
(c) a liquid disposed on the liquid transporting material; and
(d) wherein a end portion of the thermally conductive sheet is thicker than the portion thereof providing the enclosure.

23. The thermal management system recited in claim 22 wherein the enclosure includes a flexible membrane mounted over the thinner portion of the thermally conductive sheet.

24. A thermal management system, comprising:
(a) an enclosure comprising:
(i) a thin flexible, thermally conductive sheet, a first end portion of the thermally conductive sheet being adapted for thermal coupling to a heat source and the opposite end portion being adapted for thermal coupling to a heat sink; and
(ii) a flexible membrane having peripheral ends attached to a second portion of the thermally conductive sheet;
(b) a liquid transporting material disposed within the enclosure, the liquid transporting material having opposite end portions disposed adjacent the heat source coupling end and the heat sink coupling end of the thermally conductive sheet, respectively;
(c) a liquid disposed on the liquid transporting material; and
(d) wherein the first end portion of the thermally conductive sheet is thicker that the second portion of such sheet.

25. The thermal management system recited in claim 24 wherein the liquid is adapted for conversion to a vapor from heat emanating from a heat source coupled to the heat source coupling end of the thermally conductive sheet, such vapor being adapted to passes through the enclosure to the heat sink coupling end of the thermally conductive sheet for condensation to the liquid as the vapor transfers heat therein to the heat sink, the liquid transporting material being adapted to then transport the condensed liquid to end of the material disposed adjacent the heat source coupling end of the thermally conductive sheet.

26. The system recited in claim 25 wherein the first end portion is folded 180 degrees.

* * * * *